(12) United States Patent
Fanuef et al.

(10) Patent No.: US 7,244,889 B2
(45) Date of Patent: Jul. 17, 2007

(54) SYSTEMS AND APPARATUS FOR FLEXIBLE THERMAL MANAGEMENT COUPLING

(75) Inventors: Barrett Fanuef, Olympia, WA (US); Tomm Aldridge, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/168,909

(22) Filed: Jun. 28, 2005

(65) Prior Publication Data

US 2006/0289187 A1    Dec. 28, 2006

(51) Int. Cl.
*H05K 5/00* (2006.01)
(52) U.S. Cl. .................. 174/17 VA; 174/50; 361/600
(58) Field of Classification Search ........... 174/17 VA, 174/50; 361/600, 679, 687, 700, 699, 707; 257/714
See application file for complete search history.

(56) References Cited

U.S. PATENT DOCUMENTS

| | | | |
|---|---|---|---|
| 5,973,261 A * | 10/1999 | Chevallet et al. | 174/17 VA |
| 6,097,596 A * | 8/2000 | Cipolla et al. | 361/687 |
| 6,723,913 B1 * | 4/2004 | Barbetta | 174/17 VA |
| 2003/0133257 A1 * | 7/2003 | Beihoff et al. | 361/600 |

* cited by examiner

*Primary Examiner*—Dhiru R. Patel
(74) *Attorney, Agent, or Firm*—Buckley, Maschoff & Talwalkar LLC

(57) ABSTRACT

According to some embodiments, systems and apparatus for flexible thermal management coupling are provided. For example, an apparatus or system may includes a conduction component to conduct heat to a thermal management device, a flexible component defining a cavity, wherein the flexible component is to couple the conduction component to an electronic device, and a heat transfer component coupled to transfer heat, via the flexible component, from the electronic device to the conduction component.

21 Claims, 8 Drawing Sheets

SYSTEMS AND APPARATUS FOR FLEXIBLE THERMAL MANAGEMENT COUPLING

BACKGROUND

Electronic devices are often cooled by utilizing various forms of heat dispersion devices and/or heat removal techniques. Computers or computer servers may, for example, incorporate liquid cooling systems to maintain proper operating temperatures. In high-density electronic systems, such as server farms or blade centers, individual electronics devices (e.g., blade servers and/or other servers) may transfer heat to a centralized thermal management system or device. The centralized thermal management system may, for example, be a liquid cooling system designed or configured to remove heat from a plurality of electronics devices.

In such configurations, it may often be desirable to transfer heat from the electronics devices to the thermal management system without requiring fluid connections between the server and centralized cooling systems. Such coupling must often, however, be capable of compensating for various movements between the two cooling systems and/or devices. Typical methods of movement compensation often involve complex and/or expensive devices that may not be suitable and/or desirable.

DETAILED DESCRIPTION

Figure 1:
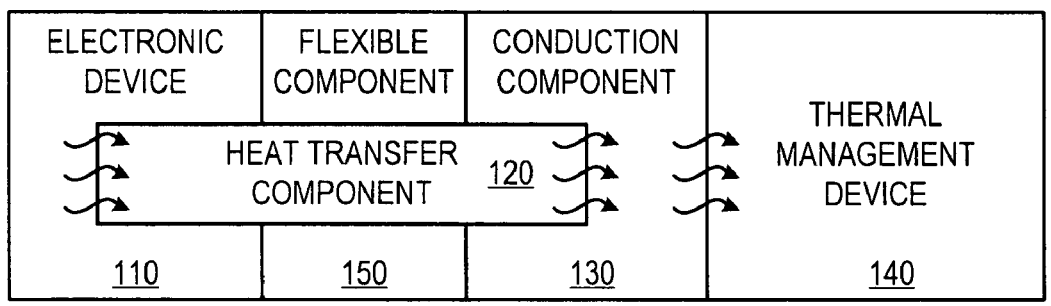
FIG. 1 is a block diagram of a system according to some embodiments.

Referring first to FIG. 1, a block diagram of a system 100 according to some embodiments is shown. The various systems described herein are depicted for use in explanation, but not limitation, of described embodiments. Different types, layouts, quantities, and configurations of any of the systems described herein may be used without deviating from the scope of some embodiments. Fewer or more components than are shown in relation to the systems described herein may be utilized without deviating from some embodiments.

The system 100 may comprise, for example, an electronic device 110 (such as a processor, a computer, a computer server, memory device, a voltage regulator, etc.), a heat transfer component 120, a conduction component 130, a thermal management device 140, and/or a flexible component 150. In some embodiments, the electronic device 110 may generate heat and/or may transfer heat to the heat transfer component 120 (e.g., as depicted via the wavy lines in FIG. 1). The heat transfer component 120 may, for example, be coupled to the electronic device 110 to accept and/or remove heat from the electronic device 110. The heat transfer component 120 may comprise, for example, a passive and/or active cooling solution (e.g., a heat pipe, a thermosyphon, a heat exchanger, and/or any other type of liquid or other cooling system or device) associated with the removal of heat from the electronic device 110. In some embodiments, the heat transfer component 120 may be or include a portion and/or component of the electronic device 110.

According to some embodiments, the heat transfer component 120 may further be coupled to transfer the heat received from the electronic device 110 to the conduction component 130 (e.g., as also depicted via the wavy lines in FIG. 1). The conduction component 130 may, for example, comprise one or more plates, objects, surfaces, and/or other devices configured to conduct heat. In some embodiments, the conduction component 130 may be coupled to transfer the heat received from the heat transfer component 120 to the thermal management device 140 (e.g., as further depicted via the wavy lines in FIG. 1). The conduction component 130 may, for example, be configured to mate, dock, and/or otherwise couple with and/or to the thermal management device 140 (and/or a portion thereof) so that heat may be transferred at least via conduction to the thermal management device 140. The coupling of the conduction component 130 and the thermal management device 140 may, according to some embodiments, be or include a thermal and/or a physical coupling.

In some embodiments, the flexible component 150 may be utilized in the system 100 to facilitate accommodation of various movements and/or forces between the electronic device 110, the conduction component 130, and/or the thermal management device 140. In the case that the electronic device 110 comprises a computer server (such as a blade server) and the thermal management device 140 comprises a centralized cooling solution (e.g., for removing heat from a plurality of electronic devices 110), for example, the conduction component 130 may be coupled to the electronic device 110 via the flexible component 150 (e.g., in addition to being thermally and/or physically coupled to the thermal management devise 140). The flexible component 150 may, according to some embodiments, be configured to compensate, absorb, and/or otherwise accommodate for forces experienced due to movements of the electronic device 110 and/or the thermal management device 140. The coupling of the electronic device 110 and the thermal management device 140 (e.g., via the heat transfer component 120, the conduction component 130, and/or the flexible component 150) may, for example, be capable of withstanding movement forces due to the utilization of the flexible component 150.

The flexible component 150 may also or alternatively couple to, contain, and/or otherwise be associated with the heat transfer component 120. The heat transfer component 120 may, for example, pass through and/or include the flexible component 150. According to some embodiments, the flexible component 150 may define one or more portions of the heat transfer component 120. In the case that the heat transfer component 120 comprises tubes, channels, conduits, and/or paths, for example, the flexible component 150 may define and/or comprise a portion of those tubes, channels, conduits, and/or paths. The flexible component 150 may, according to some embodiments for example, facilitate the transfer of heat from the electronic device 110 and/or from the heat transfer component 120 to the conduction component 130.

Figure 2:
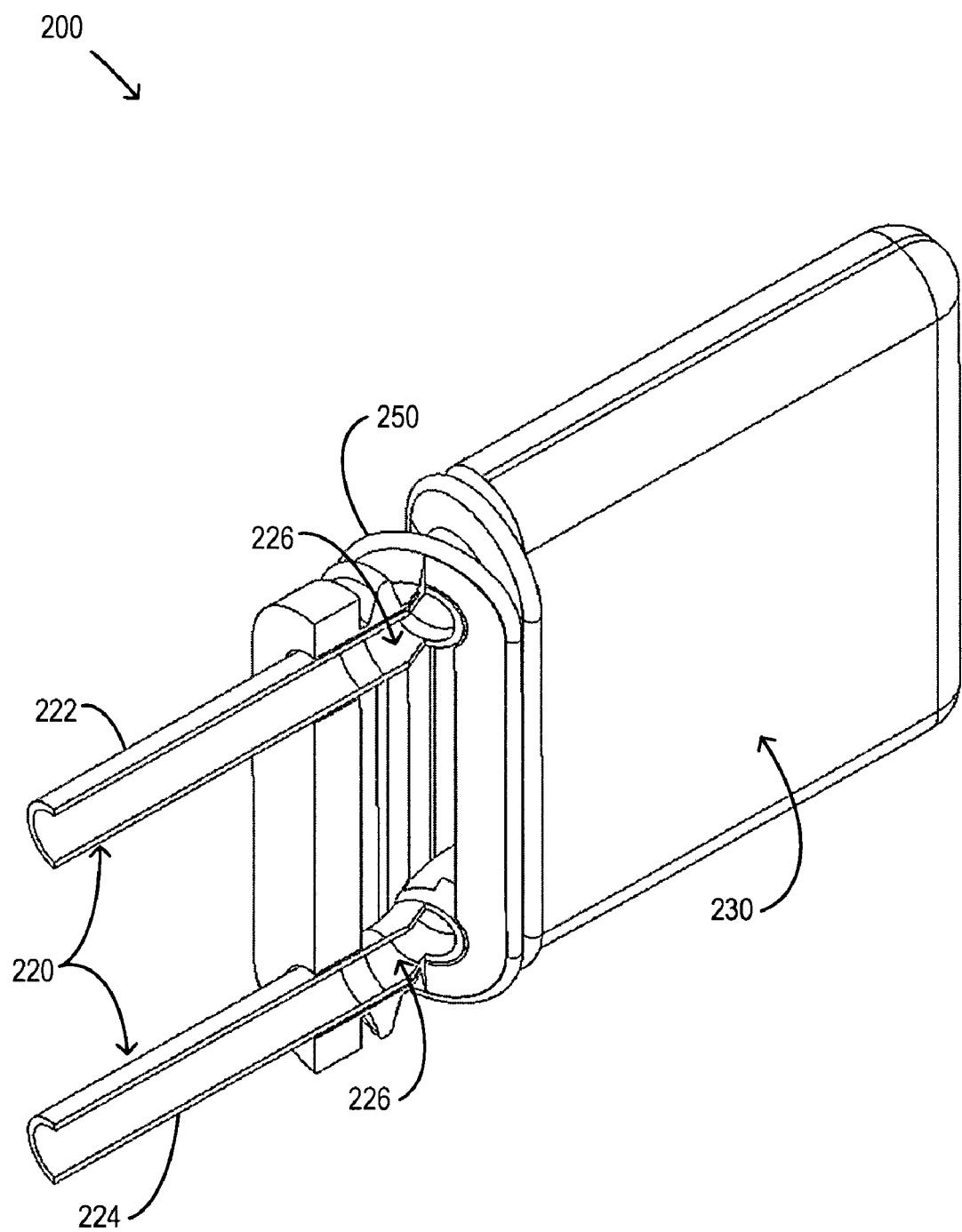
FIG. 2 is a partially cut-away perspective diagram of an apparatus according to some embodiments.

Turning in more detail to FIG. 2, a partially cut-away perspective diagram of an apparatus 200 according to some embodiments is shown. The apparatus 200 may, for example, be similar in configuration and/or functionality to any of the heat transfer component 120, the conduction component 130, and/or the flexible component 150 described in conjunction with FIG. 1. In some embodiments, the apparatus 200 may comprise, for example, a heat transfer component 220. The heat transfer component 220 may, according to some embodiments, comprise an inlet 222, and outlet 224, and/or flexible portions 226. In some embodiments, the apparatus 200 may also comprise a conduction component 230 and/or a flexible component 250. In some embodiments, fewer or more components than are shown in FIG. 2 may be included in the apparatus 200.

According to some embodiments, heat transfer component 220 may comprise a portion of a cooling solution (not shown) associated with an electronic device (such as the electronic device 110). The inlet 222 and the outlet 224 may, for example, comprise portions of a fluid flow path associated with and/or connected to a fluid cooling system. In some embodiments, the inlet 222 may provide a heated fluid to the conduction component 230, for example, and/or the outlet 224 may provide the cooled fluid (e.g., due to transfer of heat from the fluid to the conduction component 230) back to the fluid cooling system. The inlet 222 and/or the outlet 224 may also or alternatively provide heat to the conduction component 230 via any other means (e.g., other than fluid transport) that is or becomes known or practicable. The inlet 222 and/or the outlet 224 may, for example, comprise one or more solid conductive elements such as metal wires, bars, and/or coils.

In some embodiments, the heat transfer component 220 (and/or the inlet 222 and/or the outlet 224 thereof) may comprise the flexible portions 226. The flexible portions 226 may, for example, provide flexibility to the connection with the conduction component 230. In the case that the conduction component 230 moves with respect to the heat transfer portion 220 (and/or the cooling solution associated therewith), for example, the flexible portions 226 may allow the connection to be maintained by flexing to accommodate movement forces. In some embodiments, the flexible portions 226 may comprise substantially all of the inlet 222 and/or the outlet 224. The heat transfer component 220 may, for example, comprise one or more flexible tubes that define the flexible portions 226 substantially along the entire length of the flexible tubing.

The conduction component 230 may, according to some embodiments, comprise one or more plates, surfaces, and/or other objects configured to transfer heat via conduction. As shown in FIG. 2, for example, the conduction component 230 may comprise and/or define a device within which the heat transfer component 220 and/or the inlet 222 and outlet 224 thereof may at least partially be disposed. The conduction component 230 may, according to some embodiments, be configured, shaped, and/or designed to mate, dock, be inserted into, and/or otherwise couple to a thermal management device (such as the thermal management device 140). In some embodiments, multiple conduction components 230 may be coupled to receive heat from the heat transfer component 220.

According to some embodiments, the flexible component 250 may couple to the conduction component 230. The flexible component 250 may, for example, be bonded and/or otherwise coupled to flexibly couple to the conduction component 230. The flexible component 250 may also, for example, cover, shield, protect, envelope, contain, and/or otherwise house a portion of the heat transfer component 220 (e.g., as shown). The flexible component 250 may, for example, be or include a boot, cover, housing, and/or other flexible device. In some embodiments, the flexible component 250 may be coupled to the heat transfer component 220. A portion of the heat transfer component 220 (such as the inlet 222, the outlet 224, and/or the flexible portions 226) may, for example, extend through and/or be coupled to the flexible component 250. According to some embodiments, the flexible component 250 may comprise various detents, paths, and/or other features (e.g., molded and/or extruded features) configured to accept, guide, and/or couple to the heat transfer component 220.

Figure 3:
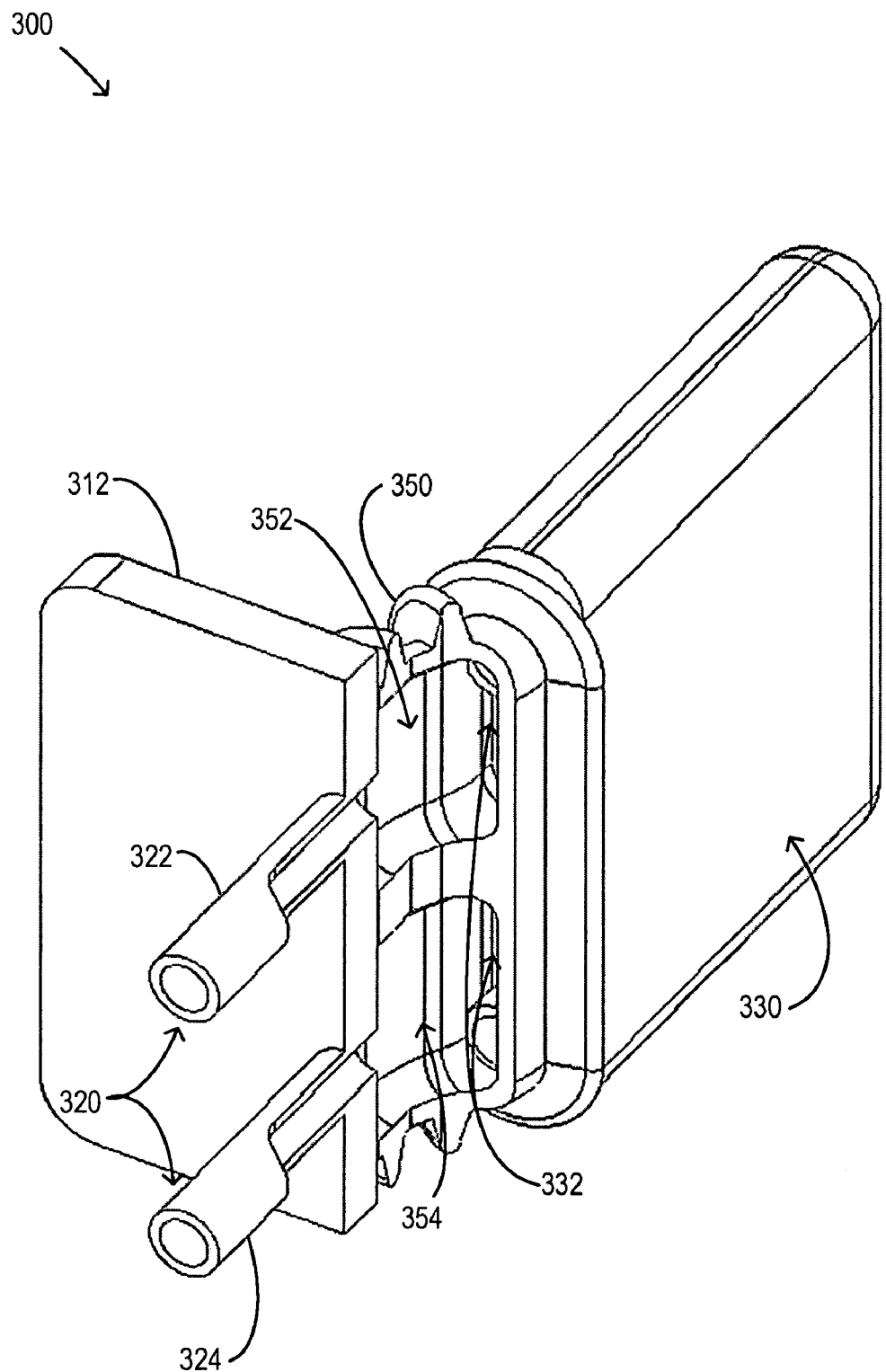
FIG. 3 is a partially cut-away perspective diagram of an apparatus according to some embodiments.

Referring now to FIG. 3, a partially cut-away perspective diagram of an apparatus 300 according to some embodiments is shown. The apparatus 300 may, for example, be similar in configuration and/or functionality to the apparatus 200 and/or any of the heat transfer component 120, 220, the conduction component 130, 230, and/or the flexible component 150, 250 described in conjunction with any of FIG. 1 and/or FIG. 2. In some embodiments, the apparatus 300 may comprise, for example, a mounting device 312 and/or a heat transfer component 320. The heat transfer component 320 and/or the mounting device 312 may, according to some embodiments, comprise an inlet 322 and/or an outlet 324. In some embodiments, the apparatus 300 may also comprise a conduction component 330 defining a volume 332 and/or a flexible component 350 defining first and second cavities 352, 354. According to some embodiments, the components 320, 322, 324, 330, 350 of the apparatus 300 may be similar in configuration and/or functionality to the similarly-named components described in conjunction with any of FIG. 1 and/or FIG. 2. In some embodiments, fewer or more components than are shown in FIG. 3 may be included in the apparatus 300.

In some embodiments, the mounting device 312 may be or include a portion of a chassis and/or other component of an electronics device (not shown in FIG. 3) such as the electronics device 110, and/or may be or include a separate device for coupling various components of the apparatus 300. The mounting device 312 may, for example, be, include, and/or define a portion of the heat transfer component 320. In some embodiments, the mounting device 312 may define, for example, the inlet 322 and/or the outlet 324 of the heat transfer component 320. According to some embodiments, the mounting device 312 may comprise a rigid and/or semi-rigid component that defines rigid and/or semi-rigid inlet 322 and outlet 324 fluid transfer portions of the heat transfer component 320 (e.g., as shown). In some embodiments, the heat transfer component 320 may comprise other tubing, channels, conduits, paths, and/or other components or devices in addition to the inlet 322 and/or the outlet 324. The heat transfer component 320 may, for example, comprise tubes (e.g., flexible tubing) and/or other devices that connect and/or couple to the inlet 322 and outlet 324 portions defined by the mounting device 312. In such a manner, for example, the mounting device 312 (and/or the apparatus 300) may be easily and/or quickly connected and/or assembled to mating portions of the heat transfer component 320 associated with an electronics device cooling solution (such as a liquid cooling system).

In some embodiments, the flexible component 350 may be configured to facilitate heat transfer (and/or fluid transfer) from the mounting device 312 (and/or the inlet 324) to the conduction component 330. The flexible component 350 may, for example, define the first cavity 352 that may function as and/or define a portion of the heat transfer component 320. According to some embodiments, the flexible component 350 may couple to the mounting device 312, for example, to form a substantially hermetic seal such that fluid flowing from the inlet 322 may enter the first cavity 352 without leaking from the apparatus 300. The first cavity 352 may, according to some embodiments, function as a continuation of the fluid flow path associated with the inlet 322. The flexible component 350 may also couple to the conduction component 330. The flexible component 350 may, for example, couple to both the mounting device 312 and the conduction component 330 to flexibly couple the conduction component 330 to the mounting device 312.

According to some embodiments, the flexible component 350 may supply heat and/or heated fluid (e.g., received from the inlet 322) to the conduction component 330. The conduction component 330 may, for example, comprise one or more conduction plates that define the volume 332. The volume 332 may be a single continuous space within the conduction component 330 and/or may comprise various sub-volumes, partitions, channels, paths, and/or otherwise may be segmented and/or defined. In some embodiments, the volume 332 may, for example, define a fluid flow path that is configured to receive the heated fluid from the first cavity 352. The volume 332 may also or alternatively be configured to promote and/or facilitate heat transfer form the heated fluid to the conduction component 330. The volume 332 may also be configured to provide the cooled fluid to the second cavity 354 of the flexible component 350. The second cavity 354 defined by the flexible component 350 may, for example, also define a portion of the heat transfer component 320 and/or a fluid (and/or heat) flow path associated therewith. Cooled fluid may be received by the second cavity 354, according to some embodiments, and may be provided to the outlet 354 the coupling (and/or hermetic coupling) of the flexible component 350 to the mounting device 312 may, for example, allow the cooled fluid to be received by the outlet 324 without leaking from the apparatus 300.

According to some embodiments, the flexible component 350 may also or alternatively allow, accommodate, and/or facilitate the movement of the conductive component 330 with respect to the mounting device 312. The flexible component 350 may, for example, be comprised of flexible materials such as rubber, flexible plastic, and/or flexible metals that permit the flexible component 350 to be pliant in the presence of forces upon the connection between the conduction component 330 and the mounting device 312. In some embodiments, the flexible component 350 may bend, extend, compress, contract, and/or otherwise alter in shape or orientation to accommodate any of a variety of forces. As shown in FIG. 3, for example, the flexible component 350 may flex to one side (e.g., the right side as shown) to accommodate a lateral displacement between the conduction component 330 and the mounting device 312. According to some embodiments, the movement and/or displacement forces may be associated with devices coupled to the conduction component 330 (e.g., a thermal management device 140) and/or to the mounting device 312 (e.g., an electronic device 110).

Figure 4:
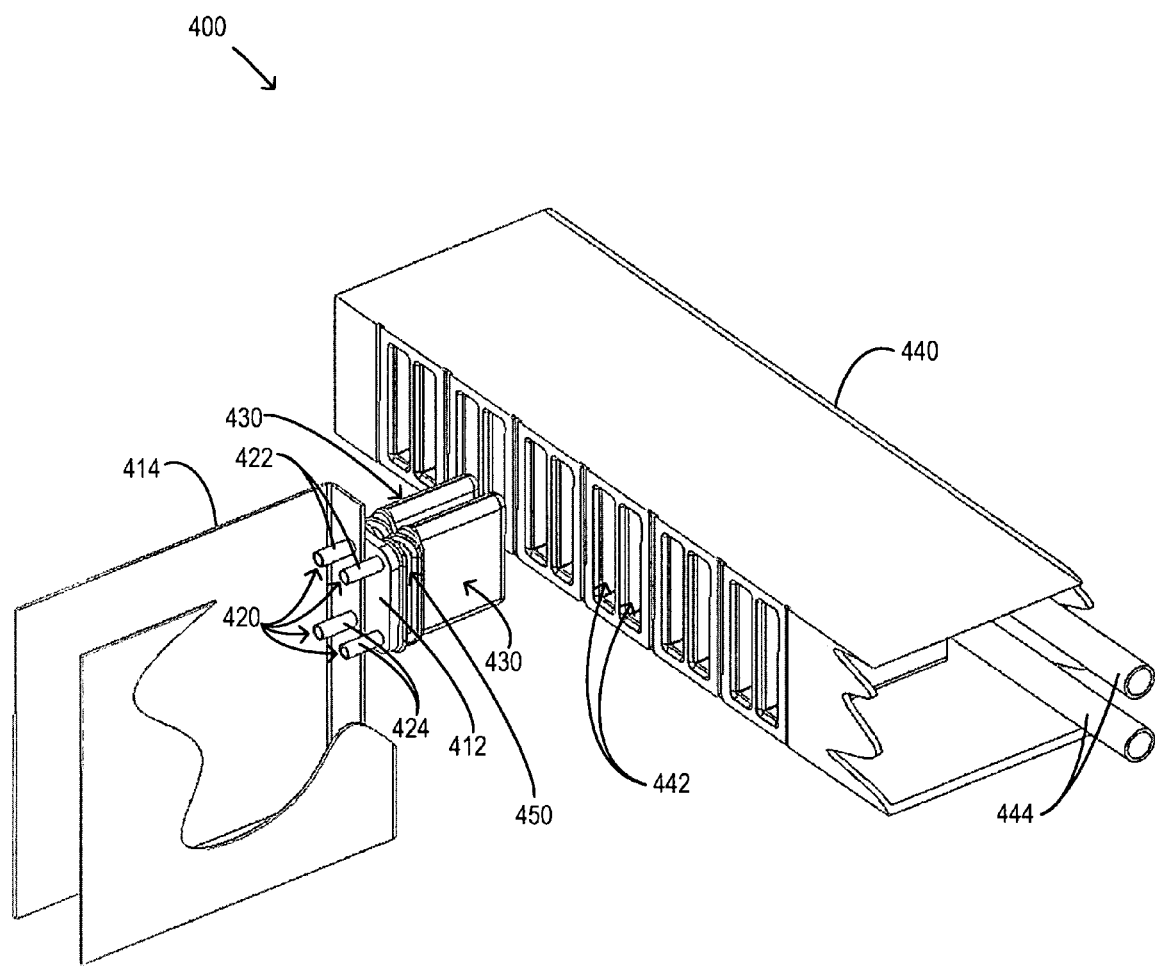
FIG. 4 is a partially cut-away perspective diagram of a system according to some embodiments.

Referring to FIG. 4, for example, a partially cut-away perspective diagram of a system 400 according to some embodiments is shown. The system 400 may, for example, be similar in configuration and/or functionality to the system 100 described in conjunction with FIG. 1 herein. In some embodiments, the system 400 may comprise, for example, a mounting device 412, a chassis 414, and/or a heat transfer component 420. The heat transfer component 420 and/or the mounting device 412 may, according to some embodiments, comprise one or more inlets 422 and/or one or more outlets 424. In some embodiments, the system 400 may also comprise one or more conduction components 430 and/or a thermal management device 440. The thermal management device 440 may comprise, for example, one or more ports 442 and/or one or more heat transport devices 444. The system 400 may also comprise one or more flexible components 450. According to some embodiments, the components 412, 420, 422, 424, 430, 440, 450 of the system 400 may be similar in configuration and/or functionality to the similarly-named components described in conjunction with any of FIG. 1, FIG. 2, and/or FIG. 3. In some embodiments, fewer or more components than are shown in FIG. 4 may be included in the system 400.

According to some embodiments, the chassis 414 may be or include a portion of an electronic device (not shown) such as the electronic device 110 from FIG. 1. The chassis 414 may, for example, be a typical cover, container, and/or physical platform associated with a computational device such as a computer server. In some embodiments, the mounting device 412 may be coupled to the chassis 414. According to some embodiments, the mounting device 412 may be or include a portion of the chassis 412. The mounting device 412 may, for example, be a molded, extruded, welded, and/or otherwise integral, formed, and/or attached portion of the chassis 414. In some embodiments, the mounting device 412 may removably couple to the chassis 414.

For example, the mounting device 412 may comprise and/or define the inlet 422 and/or outlet 424 portions of the heat transfer component 420. As shown in FIG. 4, multiple inlets 422, outlets 424, flexible components 450, and/or conduction components 430 may be associated with the system 400. In some embodiments, a single mounting device 412 (as shown) may be utilized to couple the plurality of components 422, 424, 430, 450 shown. According to some embodiments, multiple mounting device 414 and/or singular inlets 422, outlets 424, flexible components 450, and/or conduction components 430 may also or alternatively be utilized. The exemplary configuration shown in FIG. 4 utilizes a single mounting device 412 to couple two sets of inlets 422, outlets 424, flexible components 450, and conduction components 430 to the chassis 414.

In some embodiments, the inlet 422 and/or outlet 424 portions of the heat transfer component 420 may be molded and/or otherwise formed from the same material and/or piece of material that defines the mounting device 412. In some embodiments (such as shown in FIG. 4), the inlet 422 and the outlet 424 portions may extend and/or protrude into the chassis 414. Inside of the chassis 414, for example, the inlet 422 and the outlet 424 portions may mate and/or couple to other portions (not shown) of the heat transfer component 420 such as fluid flow devices (e.g., tubes) associated with a cooling system for the electronics device housed by the chassis 414. In such a manner, for example, heat from the electronics device (and/or otherwise from within the chassis 414) may be transferred via the inlets 422, through the mounting device 412, and into the flexible component 450.

The flexible component 450 may, as described elsewhere herein for example, flexibly couple the conduction components 430 to the mounting device 412 (and thus to the chassis 414). In some embodiments, the flexible components 450 may protect, cover, and/or facilitate conveyance of portions of the heat transfer component 420. According to some embodiments (such as described in conjunction with FIG. 3), the flexible components 450 may also or alternatively define portions of the heat transfer component 420. Although two flexible components 450 are shown in FIG. 4 as coupling the conduction components 430 to the mounting device 412, the flexible components 450 may alternatively comprise a single flexible component 450 configured to couple and/or facilitate heat transfer, as desired. According to some embodiments, the flexible components 450 may facilitate the transfer of heat (e.g., via the heat transfer component 420) to the conduction components 430. In such a manner, for example, the heat from the electronics device and/or otherwise from within the chassis 414 may be transferred to the conduction components 430.

In some embodiments, the flexible components 430 may be inserted into, docked, and/or otherwise coupled to the ports 442 of the heat management device 440. The heat management device 440 may, as shown for example, comprise a plurality of ports 442 for receiving a plurality of conduction components 430 (e.g., potentially associated with a plurality of electronic devices). Upon coupling to the ports 442 of the heat management device 440, for example, the conduction components 430 may transfer (e.g., at least via conduction) heat to the thermal management device 440. In some embodiments, the thermal management device 440 may comprise the heat transport devices 444 that may, for example, receive the conducted heat from the ports 442. According to some embodiments, the heat transport devices 444 (e.g., as shown) may comprise any configuration of tubes, channels, conduits, paths, and/or other heat conveyances that are or become know or practicable. The heat transport devices 444 may, for example, comprise fluid and/or liquid transport devices for transporting heated fluid and/or liquid away from the ports 442 and/or for transporting cooled fluid and/or liquid to the ports 442 (e.g., defining and/or comprising a fluid and/or liquid cooling loop). In such a manner, for example, two cooling systems (e.g., two liquid cooling systems) may be flexibly connected without requiring fluid connections there between (e.g., maintaining each cooling system as a separate closed loop).

Figure 5:
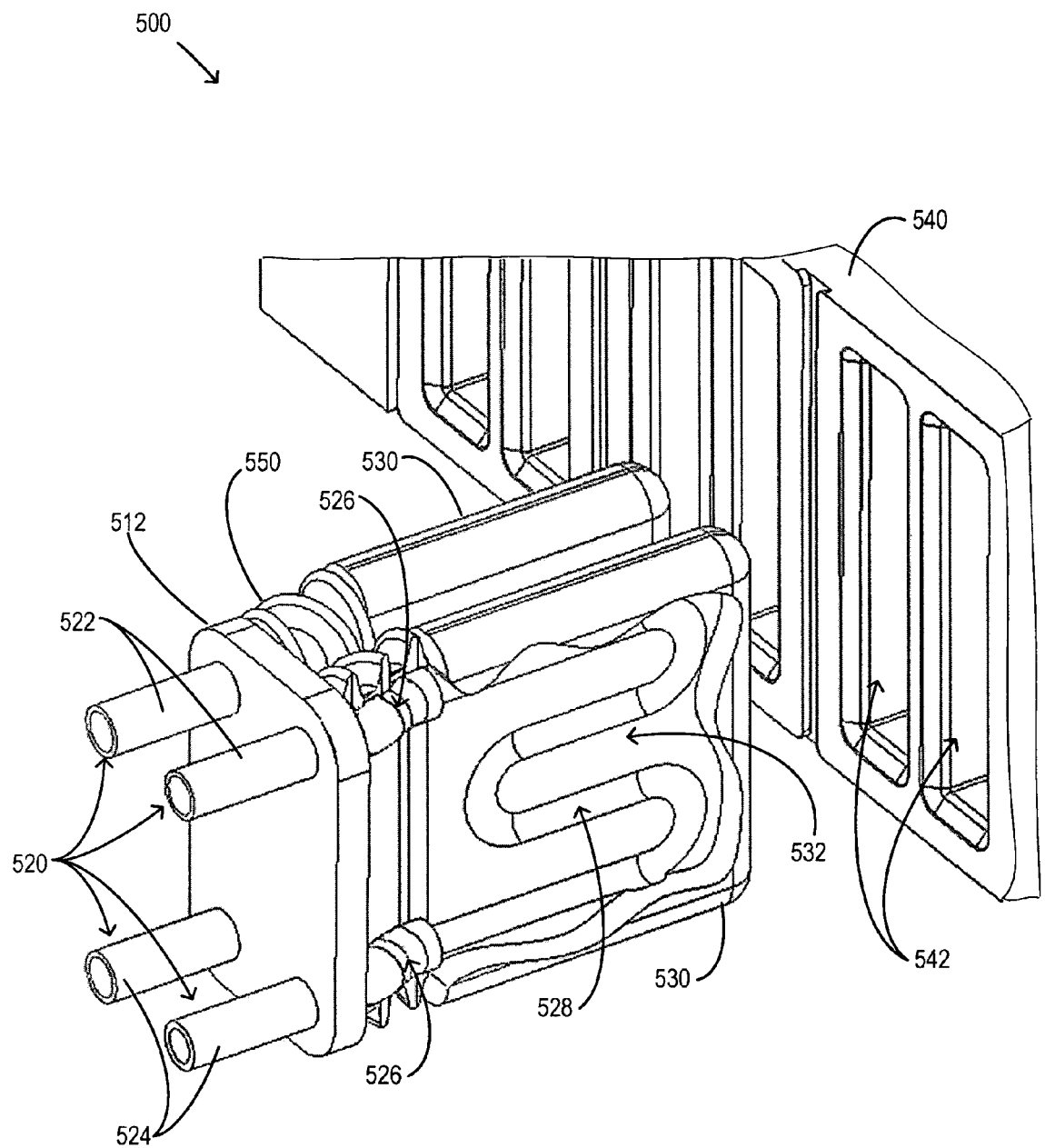
FIG. 5 is a partially cut-away perspective diagram of a system according to some embodiments.

Turning to FIG. 5, for example, a partially cut-away perspective diagram of a system 500 according to some embodiments is shown. The system 500 may, for example, be similar in configuration and/or functionality to the systems 100, 400 described in conjunction with any of FIG. 1 and/or FIG. 4 herein. In some embodiments, the system 500 may comprise, for example, a mounting device 512 and/or a heat transfer component 520. The heat transfer component 520 and/or the mounting device 512 may, according to some embodiments, comprise one or more inlets 522, one or more outlets 524, one or more flexible portions 526, and/or a heat dispersion portion 528. In some embodiments, the system 500 may also comprise one or more conduction components 530 defining one or more volumes 532 and/or a thermal management device 540. The thermal management device 540 may comprise, for example, one or more ports 542. The system 500 may also comprise one or more flexible components 550. According to some embodiments, the components 512, 520, 522, 524, 526, 530, 540, 542, 550 of the system 500 may be similar in configuration and/or functionality to the similarly-named components described in conjunction with any of FIG. 1, FIG. 2, FIG. 3, and/or FIG. 4. In some embodiments, fewer or more components than are shown in FIG. 5 may be included in the system 500.

According to some embodiments, the heat transfer component 520 may comprise any type or configuration of device that is or becomes known or practicable for transferring heat to the conduction components 530. In the exemplary embodiment shown in FIG. 5, for example, the heat transfer component 520 may comprise a fluid and/or liquid flow path between the mounting device 512 and the conduction components 530. The liquid flow path may, according to some embodiments, comprise one or more inlet portions 522 to provide heated liquid to the mounting device 512 and/or to the flexible components 550 and/or to the flexible portions 526 of the heat transfer component 520. The inlet portions 522 may, in some embodiments, be defined by the mounting device 512 (such as the molded, extruded, and/or otherwise formed hollow protrusions of the mounting device 512, as shown). According to some embodiments, the heat transfer component 520 may comprise the flexible portions 526 and/or may utilize the flexible components 550 (and/or features thereof) to transport the heated liquid into the volume 532 defined by the conduction components 530. In some embodiments, the heat transfer component 520 may comprise an active and/or passive heat transfer device. The heat transfer component 520 may comprise active (e.g., pumped) liquid paths, for example, and/or may comprise passive thermosyphon, capillary, conductive, and/or wicking devices.

As shown in FIG. 5, the heat transfer component 520 may comprise the heat dispersion portion 528 disposed within the volume 532 of the conduction components 530. The heat dispersion portion 528 may, according to some embodiments, simply comprise a serpentine and/or otherwise snaked and/or tortuous portion of the fluid and/or liquid flow path of the heat transfer component 520. The heat dispersion portion 528 may, for example, comprise a substantially serpentine portion of tubing (and/or other conduit, channel, or path) that snakes through the volume 532 of the conduction components 530. The serpentine and/or other tortuous configuration may, for example, promote, facilitate, and/or increase heat transfer from the heated liquid (and/or otherwise from the heat transfer component 520) to the conduction components 530. In some embodiments, the heat dispersion portion 528 may also or alternatively comprise other dispersion devices such as wick structures, fins, and/or micro-channels. In some embodiments, once heat is dispersed and/or removed from the liquid (e.g., at least in part due to the heat dispersion portion 528) the cooled liquid may proceed via a flexible portion 526 to the outlet 524. The outlet 524 may, for example, provide the cooled liquid to a liquid cooling system associated with an electronic device (not shown in FIG. 5).

According to some embodiments, the flexible components 550 may allow the conduction components 530 to be flexibly coupled to the mounting device 512. In the case that the conduction components 530 are inserted into, docked, and/or otherwise coupled with the ports 542 of the heat management device 540, for example, the flexible components 550 may allow the conduction components 530 to move with respect to the mounting device 512, while maintaining the integrity of the heat transfer component 520 and/or the connections between components 512, 520, 522, 524, 526, 528, 530. As shown in FIG. 5, for example, the flexible components 550 may flex to the left to accommodate for a lateral movement between the heat management device 540 (and any conduction component 530 coupled thereto) and the mounting device 512.

Figure 6:
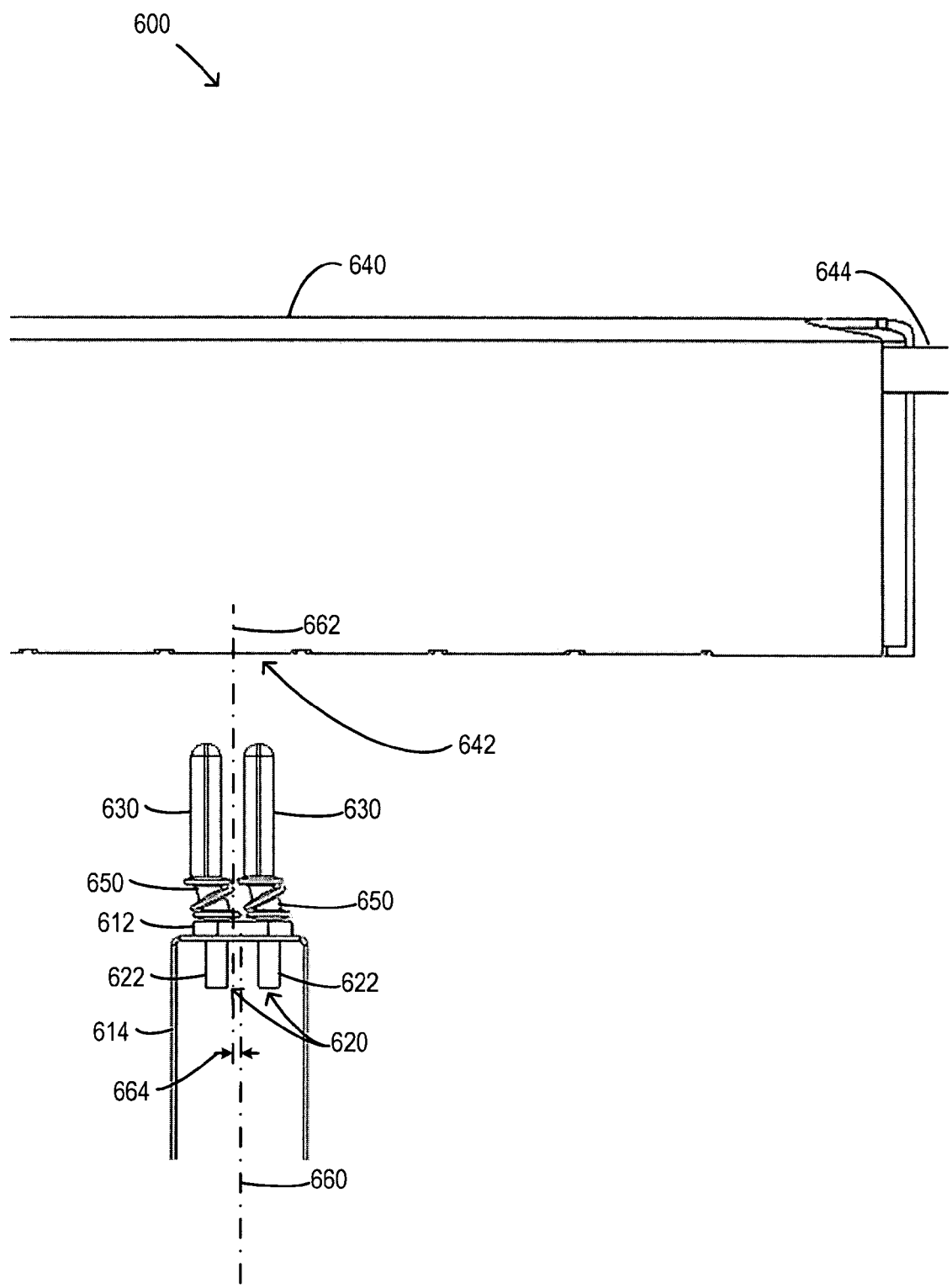
FIG. 6 is a block diagram of a system according to some embodiments.

Referring in more detail to FIG. 6, for example, a block diagram of a system 600 according to some embodiments is shown. The system 600 may, for example, show an overhead and/or top view of a system similar to the systems 100, 400, 500 described in conjunction with any of FIG. 1, FIG. 4, and/or FIG. 5 herein. In some embodiments, the system 600 may comprise, for example, a mounting device 612, a chassis 614, and/or a heat transfer component 620. The heat transfer component 620 and/or the mounting device 612 may, according to some embodiments, comprise one or more inlets 622 (and/or one or more outlets that are not shown in FIG. 6). In some embodiments, the system 600 may also comprise one or more conduction components 630 and/or a thermal management device 640. The thermal management device 640 may comprise, for example, one or more ports 642 and/or one or more heat transport devices 644. The system 600 may also comprise one or more flexible components 650. According to some embodiments, the components 612, 614, 620, 622, 630, 640, 642, 644, 650 of the system 600 may be similar in configuration and/or functionality to the similarly-named components described in conjunction with any of FIG. 1, FIG. 2, FIG. 3, FIG. 4, and/or FIG. 5. In some embodiments, fewer or more components than are shown in FIG. 6 may be included in the system 600.

In some embodiments, the conduction components 630 may transfer heat to the ports 642 and/or heat transfer devices 644 of the heat management device 640 by coupling thereto as described elsewhere herein. In such a manner, for example, heat may be transferred (e.g., without requiring fluid connections between the heat management device 640 and any other cooling system) from an electronics device (e.g., disposed within the chassis 614, but not shown in FIG. 6) to the heat management device 640. According to some embodiments, the flexible components 650 may provide a flexible connection that accommodates for movements in the system 600 while potentially reducing part count for the system 600, reducing assembly complexity, reducing manufacturing costs, increasing reliability of the system 600, and/or otherwise providing advantages over previous systems.

As an example, the chassis 614 may define and/or be associated with a first axis 660. The first axis 660 may represent, for example, a centerline and/or orientation of the chassis 614 and/or of an electronics device associated therewith. The thermal management device 640 and/or the ports 642 thereof may also or alternatively define a second axis 662. The second axis 662 may, for example, represent the centerline of an opening associated with the port 642. In some embodiments, such as in the case that the conduction components 630 are coupled to the ports 642 (although shown in an uncoupled orientation in FIG. 6), there may be a distance 664 between the first and second axis 660, 662. As shown in FIG. 6, for example, the conduction components 630 may need to be offset to the left (e.g., by an amount equal to the distance 664) of the first axis 660 in order to attain and/or maintain proper alignment with the port 642. The flexible components 650 may accommodate this offset distance 664 by flexing, while still being able to maintain the integrity of the various connections coupling the components 612, 614, 650, 630, 640, 642 of the system 600. In some embodiments, the flexible components 650 may also or alternatively be capable of and/or configured to accommodate forces from a variety and/or combination of directions (e.g., lateral, sheer, and/or axial forces).

Figure 7:
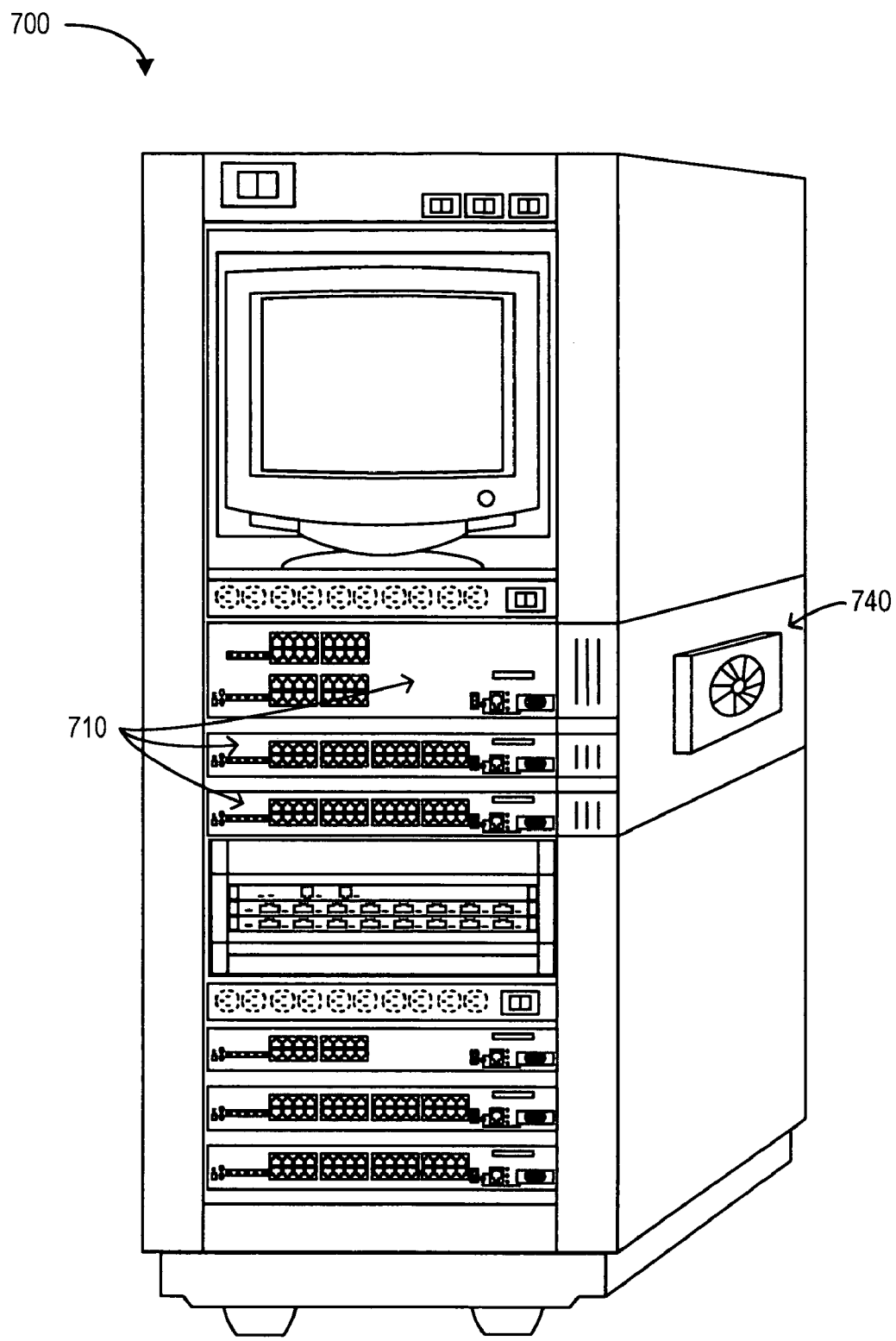
FIG. 7 is a perspective diagram of a system according to some embodiments.

Referring to FIG. 7, for example, a perspective diagram of a system 700 according to some embodiments is shown. The system 700 may, for example, be similar in configuration and/or functionality to the systems 100, 400, 500, 600 described in conjunction with any of FIG. 1, FIG. 4, FIG. 5, and/or FIG. 6 herein. In some embodiments, the system 700 may comprise an electronics device rack or cabinet such as a server farm or blade center. The system 700 may comprise, for example, one or more electronics devices 710 and/or a thermal management device 740. According to some embodiments, the components 710, 740 of the system 700 may be similar in configuration and/or functionality to the similarly-named components described in conjunction with any of FIG. 1, FIG. 2, FIG. 3, FIG. 4, FIG. 5, and/or FIG. 6. In some embodiments, fewer or more components than are shown in FIG. 7 may be included in the system 700.

According to some embodiments, the system 700 may comprise several electronic devices 710 such as servers or blade servers, as shown. The electronic devices 710 may, for example, utilize flexible heat transfer devices (not shown in FIG. 7) such as the apparatus 200, 300 described in conjunction with FIG. 2 and/or FIG. 3 to transfer heat to the thermal management device 740. The thermal management device 740 may, according to some embodiments, be a centralized cooling system configured and/or coupled to receive heat from a plurality of electronic devices 710. The thermal management device 740 may, for example, be or include a blade center and/or server rack cooling system configured to cool multiple blade servers and/or other servers or electronic devices 710. In some embodiments, the flexible heat transfer devices may allow thermal and/or physical connections between the electronic devices 710 and the thermal management device 740 to be maintained even in the case that the electronic devices 710 shift, move, vibrate, and/or are otherwise displaced (momentarily, temporarily, and/or permanently) within the system 700 (e.g., with respect to the thermal management device 740).

Figure 8:
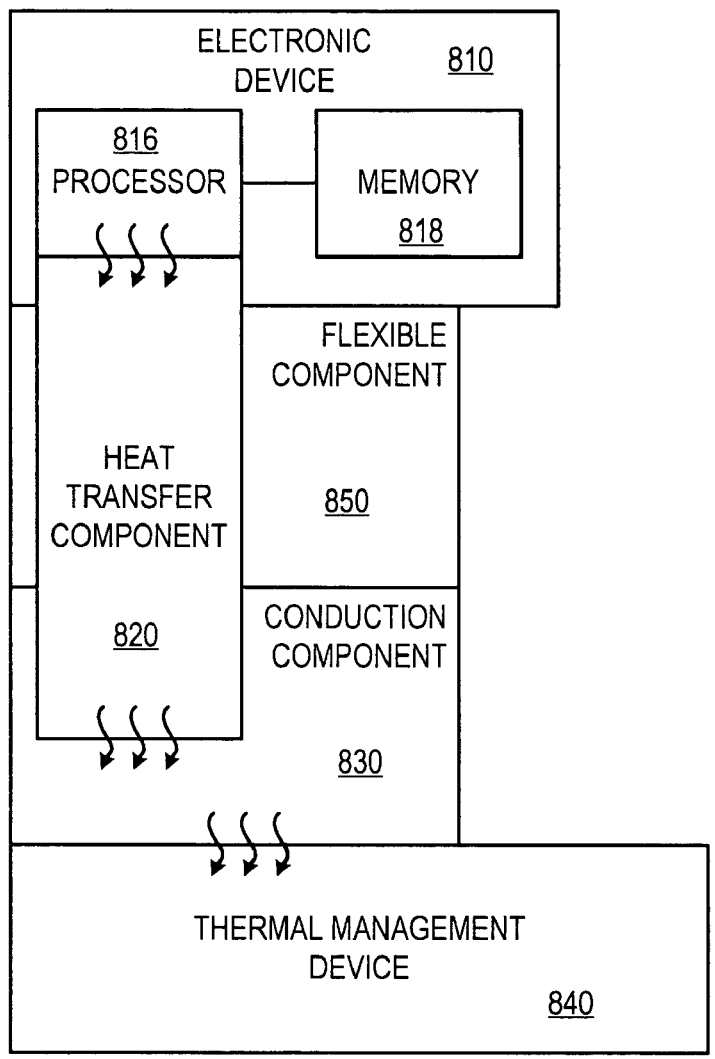
FIG. 8 is a block diagram of a system according to some embodiments.

Turning to FIG. 8, a block diagram of a system 800 according to some embodiments is shown. In some embodiments, the system 800 may be similar in configuration and/or functionality to the systems 100, 400, 500, 600, 700 described in conjunction with any of FIG. 1, FIG. 4, FIG. 5, FIG. 6, and/or FIG. 7 herein. The system 800 may comprise, for example, an electronic device 810, a processor 816, a memory 818, a heat transfer component 820, a conduction component 830, a thermal management device 840, and/or a flexible component 850. According to some embodiments, the components 810, 820, 830, 840, 850 of the system 800 may be similar in configuration and/or functionality to the similarly-named components described in conjunction with any of FIG. 1, FIG. 2, FIG. 3, FIG. 4, FIG. 4, FIG. 6, and/or FIG. 7. In some embodiments, fewer or more components than are shown in FIG. 8 may be included in the system 800.

The processor 816 may be or include any number of processors, which may be any type or configuration of processor, microprocessor, and/or micro-engine that is or becomes known or available. In some embodiments, other electronic and/or electrical components may be utilized in place of or in addition to the processor 816. The processor 816 may, for example, be or include any device, object, and/or component that generates, stores, and/or requires removal of heat. According to some embodiments, the processor 816 may be an XScale® Processor such as an Intel® PXA270 XScale® processor. The memory 818 may be or include, according to some embodiments, one or more magnetic storage devices, such as hard disks, one or more optical storage devices, and/or solid state storage. The memory 818 may store, for example, applications, programs, procedures, and/or modules that store instructions to be executed by the processor 816. The memory 818 may comprise, according to some embodiments, any type of memory for storing data, such as a single data rate random access memory (SDR-RAM), a double data rate random access memory (DDR-RAM), or a programmable read only memory (PROM).

According to some embodiments, the processor 816 of the electronics device 810 may transfer heat to the heat transfer component 820 (e.g., as represented by the wavy lines in FIG. 8). The heat transfer component 820 may, for example, comprise a cooling solution and/or system associated with and/or disposed within the electronic device 810. In some embodiments, the heat transfer component 820 may comprise and/or define a portion of such a cooling system. According to some embodiments, the heat transfer portion 820 may transfer heat to the conduction component 830 (e.g., also as represented by the wavy lines in FIG. 8). The conduction component 830 may be coupled, according to some embodiments, to transfer heat (at least via conduction) to the thermal management device 840 (e.g., as further represented by the wavy lines in FIG. 8).

In some embodiments, the heat transfer component 820 may be partially and/or substantially fully disposed within the flexible component 850 and/or the conduction component 830 (e.g., within cavities and/or volumes defined by the components 830, 850). In some embodiments, the flexible component 850 (and/or the conduction component 830) may define one or more portions of the heat transfer component 820. The flexible component 850 and/or the conduction component 830 may, for example, at least partially define one or more fluid flow paths associated with and/or defining the heat transfer portion 820.

According to some embodiments, the flexible component 850 may couple between the electronic device 810 and the conduction component 830 to define a flexible connection. In such a manner, for example, in the case that the conduction component 830 moves with respect to the electronic device 810 (e.g., due to being coupled to the thermal management device 840 that is in turn associated with a movement with respect to the electronic device 810), the heat transfer of the heat transfer component 820 may be substantially and/or entirely undisturbed and/or unaffected by the movement. The flexible component 850 may, for example, accommodate various forces and/or displacements while maintaining the heat transfer connections that ultimately provide remove the heat from the processor 816 and provide the heat to the thermal management device 840.

The several embodiments described herein are solely for the purpose of illustration. Other embodiments may be practiced with modifications and alterations limited only by the claims.

What is claimed is:

1. An apparatus, comprising:
    a conduction component to conduct heat and transfer the heat to a thermal management device;
    a flexible component defining an inlet, an outlet and connected to a fluid cooling system, a first cavity and a second cavity, wherein the flexible component is to couple the conduction component to an electronic device, the first cavity is to receive fluid from the inlet, and the second cavity is to provide fluid to the outlet; and
    a heat dispersion portion disposed at least partially within the first cavity and the second cavity of the flexible component, the heat dispersion portion to transfer heat from the electronic device to the conduction component.

2. The apparatus of claim 1, wherein the conduction component comprises one or more heat transfer plates.

3. The apparatus of claim 2, wherein the one or more heat transfer plates are inserted into one or more ports of the thermal management device that are configured to remove heat from the one or more heat transfer plates.

4. The apparatus of claim 2, wherein the one or more heat transfer plates define a volume within which at least one portion of the conduit is disposed.

5. The apparatus of claim 4, wherein the conduit is disposed within the volume in a substantially serpentine manner.

6. The apparatus of claim 1, wherein the flexible component defines at least one portion of the conduit.

7. The apparatus of claim 1, wherein the conduit comprises a fluid transfer device.

8. The apparatus of claim 7, wherein the fluid transfer device is to circulate a heat transfer fluid associated with the electronic device.

9. The apparatus of claim 1, wherein the flexible component is pleated.

10. The apparatus of claim 1, wherein the flexible component comprises a flexible boot fabricated from at least one of a rubber material, a plastic material, or a metal material.

11. The apparatus of claim 1, wherein the thermal management device comprises a cooling device for a blade center and wherein the electronic device comprises a blade server.

12. A system, comprising:
    an electronic device;
    a thermal management device to dissipate heat from a plurality of electronic devices;
    a conduction component to conduct heat and transfer the heat to the thermal management device;
    a flexible component defining an inlet, an outlet and connected to a fluid cooling system, a first cavity and a second cavity, wherein the flexible component is to couple the conduction component to the electronic device, the first cavity is to receive fluid from the inlet, and the second cavity is to provide fluid to the outlet; and
    a heat dispersion portion disposed at least partially within the first cavity and the second cavity of the flexible component, the heat dispersion portion to transfer heat from the electronic device to the conduction component.

13. The system of claim 12, wherein the conduction component comprises one or more heat transfer plates.

14. The system of claim 13, wherein the one or more heat transfer plates define a volume within which at least one portion of the conduit is disposed.

15. The system of claim 12, wherein at least one portion of the conduit is disposed within the electronic device.

16. The system of claim 12, wherein the flexible component defines at least one portion of the conduit.

17. A system, comprising:
    an electronic device, comprising;
        a chassis;
        a processor disposed within the chassis; and
        a double data rate memory coupled to the processor;
    a thermal management device to dissipate heat from a plurality of electronic devices;
    a conduction component to conduct heat and transfer the heat to the thermal management device;
    a flexible component defining an inlet, an outletand connected to a fluid cooling system, a first cavity and a second cavity, wherein the flexible component is to couple the conduction component to the electronic device, the first cavity is to receive fluid from the inlet, and the second cavity is to provide fluid to the outlet; and
    a heat dispersion portion disposed at least partially within the first cavity and the second cavity of the flexible component, the heat dispersion portion to transfer heat from the electronic device to the conduction component.

18. The system of claim 17, wherein the conduit comprises at least one portion of a cooling solution configured to remove heat from the processor of the electronic device.

19. The system of claim 18, wherein the conduit comprises one or more fluid channels for circulating a cooling fluid between the electronic device and the conduction component.

20. The system of claim 19, wherein the flexible component defines at least one portion of the one or more fluid channels.

21. The system of claim 17, wherein the thermal management device comprises a port to receive the conduction component.

* * * * *